(12) United States Patent
Chuang et al.

(10) Patent No.: US 7,642,864 B2
(45) Date of Patent: Jan. 5, 2010

(54) CIRCUITS AND DESIGN STRUCTURES FOR MONITORING NBTI (NEGATIVE BIAS TEMPERATURE INSTABILITY) EFFECT AND/OR PBTI (POSITIVE BIAS TEMPERATURE INSTABILITY) EFFECT

(75) Inventors: Ching-Te K. Chuang, South Salem, NY (US); Jae-Joon Kim, Austin, TX (US); Tae-Hyoung Kim, St. Paul, MN (US); Pong-Fei Lu, Yorktown Heights, NY (US); Saibal Mukhopadhyay, Atlanta, GA (US); Rahul M. Rao, Elmsford, NY (US); Shao-yi Wang, Fremont, CA (US)

(73) Assignee: International Business Machines Corporation, Armonk, NY (US)

( * ) Notice: Subject to any disclaimer, the term of this patent is extended or adjusted under 35 U.S.C. 154(b) by 43 days.

(21) Appl. No.: 12/021,459

(22) Filed: Jan. 29, 2008

(65) Prior Publication Data

US 2009/0189703 A1 Jul. 30, 2009

(51) Int. Cl.
*G01R 23/00* (2006.01)
*G01R 27/00* (2006.01)
*G01R 27/28* (2006.01)
*H03B 5/24* (2006.01)
*H03K 3/03* (2006.01)

(52) U.S. Cl. .......................... 331/44; 331/57; 324/600; 324/649

(58) Field of Classification Search .............. 331/44, 331/57; 324/600, 649
See application file for complete search history.

(56) References Cited

U.S. PATENT DOCUMENTS 6,476,632 B1 11/2002 La Rosa et al.
6,815,970 B2 11/2004 Rost et al.
7,009,905 B2 * 3/2006 Aipperspach et al. ....... 365/211
7,190,233 B2 3/2007 Bhushan et al.

(Continued)

OTHER PUBLICATIONS

S. Zafar et al., A Comparative Study of NBTI and PBTI (Charge Trapping) in SiO2/HfO2 Stacks with FUSI, TiN, Re Gates, 2006 Symposium on VLSI Technology Digest of Technical Papers, 3 pages.

(Continued)

*Primary Examiner*—David Mis
(74) *Attorney, Agent, or Firm*—Ryan, Mason & Lewis, LLP

(57) ABSTRACT

A ring oscillator has an odd number of NOR-gates greater than or equal to three, each with first and second input terminals, a voltage supply terminal, and an output terminal. The first input terminals of all the NOR-gates are interconnected, and each of the NOR-gates has its output terminal connected to the second input terminal of an immediately adjacent one of the NOR-gates. During a stress mode, a voltage supply and control block applies a stress enable signal to the interconnected first input terminals, and an increased supply voltage to the voltage supply terminals. During a measurement mode, this block grounds the interconnected first input terminals, and applies a normal supply voltage to the voltage supply terminals. Also included are an analogous NAND-gate based circuit, a circuit combining the NAND- and NOR-aspects, a circuit with a ring oscillator where the inverters may be coupled directly or through inverting paths, and circuits for measuring the bias temperature instability effect in pass gates.

20 Claims, 13 Drawing Sheets

U.S. PATENT DOCUMENTS

| | | |
|---|---|---|
| 7,235,998 B1 | 6/2007 | Suzuki |
| 2006/0158210 A1 | 7/2006 | Tsai et al. |
| 2006/0263913 A1 | 11/2006 | Marshall |
| 2007/0013452 A1 | 1/2007 | Bhushan et al. |

OTHER PUBLICATIONS

Mark B. Ketchen et al., Ring Oscillator Based Test Structure for NBTI Analysis, 2007 IEEE International Conference on Microelectronic Test Structures, Mar. 19-22, Tokyo, Japan, pp. 42-47.

J C Lin et al., Time Dependent Vccmin Degradation of SRAM Fabricated with High-k Gate Dielectrics, Taiwan Semiconductor Manufacturing Company Ltd., Hsinchu, Taiwan, R.O C. IEEE 07CH37867 45th Annual International Reliability Physics Symposium, Phoenix 2007, pp. 439-444.

Toshinari Takayanagi et al., A Dual-Core 64b UltraSPARC Microprocessor for Dense Server Applications ISSCC 2004 / Session 3 / Processors / 3.2, 2004 IEEE International Solid-State Circuits Conference, 10 pages.

Tae-Hyoung Kim et al., Silicon Odometer: An On-Chip Reliability Monitor for Measuring Frequency Degradation of Digital Circuits, IEEE Los Alamitos, CA, IEEE Journal of Solid State Circuits, vol. 43, No. 4, published by IEEE Apr. 2008, pp. 874-880.

Vijay Reddy et al., Impact of Negative Bias Temperature Instability on Digital Circuit Reliability, proceedings for IEEE 40th Annual International Reliability Physics Symposium, published by IEEE, Los Alamitos, CA 2002, pp. 248-254.

Klaus T. Grasser, Doctoral Dissertation, Mixed-Mode Device Simulation, Published by Technical University of Vienna, Vienna Austria, May 1999, Section 7.2 Five Stage CMOS Ring Oscillator, pp. 1-3, downloaded from http://www.iue.tuwien.ac.at/phd/grasser/node83.html, on Dec. 18, 2007.

R. Fernandez et al., AC NBTI studied in the 1 Hz-2 GHz range on dedicated on-chip CMOS circuits, IEEE Electron Devices Meeting 2006, (IE DM'06) IEEE International, San Francisco, CA Dec. 11-13, 2006, Published by IEEE, Los Alamitos, CA, Apr. 16, 2007, ISBN 1-4244-0438-X, pp. 1-4.

J.C. Lin et al., Prediction and Control of NBTI - Induced SRAM Vccmin Drift, IEEE Electron Devices Meeting 2006 (IE DM'06) IEEE International, San Francisco, CA, Dec. 11-13, 2006, Published by IEEE, Los Alamitos, CA, Apr. 16, 2007, ISBN 1-4244-0438-X, pp. 1-4.

\* cited by examiner

CIRCUIT STRUCTURE REPLACING AN INVERTER

NBTI DC STRESS

PBTI DC STRESS

MEASUREMENT MODE

NBTI CASE

PBTI CASE

US 7,642,864 B2

CIRCUITS AND DESIGN STRUCTURES FOR MONITORING NBTI (NEGATIVE BIAS TEMPERATURE INSTABILITY) EFFECT AND/OR PBTI (POSITIVE BIAS TEMPERATURE INSTABILITY) EFFECT

STATEMENT REGARDING FEDERALLY SPONSORED RESEARCH OR DEVELOPMENT

This invention was made with Government support under contract number HR0011-07-9-0002 awarded by the Defense Advanced Research Projects Agency (DARPA). The government has certain rights in this invention.

FIELD OF THE INVENTION

The present invention generally relates to electronic circuitry, with associated design structures, and, more particularly, to electronic circuits for assessing bias temperature instability effects, with associated design structures.

BACKGROUND OF THE INVENTION

The degradation of device threshold voltage under the presence of constant electrical and thermal stress is becoming a significant reliability issue in current complementary metal oxide semiconductor (CMOS) technologies. Bias temperature stress under constant voltage results in the generation of interface traps between the gate oxide and silicon substrate, which causes the threshold voltage of the device to increase, resulting in a reduced drive current for the device. Until recently, the NBTI (Negative Bias Temperature Instability) effect was considered to be more severe for p-type field effect transistors (PFETs) than the corresponding PBTI (Positive Bias Temperature Instability) effect on n-type field effect transistors (NFETs). However, with the use of metal gates and high-k gate dielectrics, PBTI is becoming an equivalently important concern. These phenomena were identified by S. Zafar, et al. in "A Comparative Study of NBTI and PBTI (Charge Trapping) in SiO2/HfO2 Stacks with FUSI, TiN, Re Gates," Symposium of VLSI Technology, June 2006.

Presently, NBTI test-circuits employ a simple ring oscillator circuit 100, as shown in FIG. 1. The frequency of ring oscillator 100 is measured before stress. In stress mode, the ring is disabled from oscillation and the supply voltage and/or temperature are increased to facilitate an accelerated stressing of the devices. Since PBTI has been considered insignificant, the impact of stress on the NFETs 102 has been ignored. After suitably stressing the ring-oscillator circuit 100, its frequency is measured again, and the difference in the pre- and post-stress frequencies is a direct indication of the extent of NBTI related degradation of the PFET devices 104 in the circuit. Note that circles 106 indicate PMOS devices under stress while circle 108 indicates and NMOS device under stress. Note also that the connection between output 110 and input 112 is omitted for clarity, and that transistors are referred to herein generically as devices.

U.S. Pat. No. 6,476,632 to La Rosa, et al. discloses a ring oscillator design for metal oxide semiconductor field effect transistor (MOSFET) device reliability investigations and its use for in-line monitoring. A method of determining the effect of the degradation of MOSFETs on the frequency of a Ring Oscillator (RO) consisting of an odd prime number of inverter stages, each of the inverters stages having an NMOS and a PMOS field-effect transistor, is described. The method includes the steps of: a) selecting one inverter from the inverter stages of the RO, the selected inverter having testable nodes, the testable nodes being connected to inputs and outputs of the NMOS and a PMOS field-effect transistor (FET) forming the selected inverter; b) simultaneously stressing under a set of stress conditions 1) all of the NMOS FETs of each of the inverter stages, 2) all of the PMOS FETs, and 3) all of the NMOS FETs and PMOS FETs in the RO; c) measuring a shift in selected device parameters in the selected inverter; d) measuring a frequency degradation of the entire RO; and e) establishing a relationship between the shift in the device parameters and the frequency degradation and relating the relationship to a known degradation mechanism. Furthermore, on-chip pass gates controlled by appropriate off-chip DC voltage signals, allow parallel DC stressing, as well as forcing an off-chip AC voltage waveform to a given MOSFET type device (either PMOSFET or NMOSFET) on every inverter stage of the RO. The RO circuit makes it possible to investigate the effect on the RO frequency degradation, caused by any DC MOSFET degradation mechanism as well as by any external AC voltage waveform known to be representative of a critical circuit operation. Thus, the dependence of the RO frequency on device degradation mechanisms activated during a critical circuit operation can be carefully investigated and quantified.

SUMMARY OF THE INVENTION

Principles of the present invention provide techniques for monitoring NBTI and PBTI effects individually, and in combination.

In an exemplary embodiment, according to one aspect of the invention, a NOR-gate based ring oscillator circuit for measurement of negative bias temperature instability effect includes a ring oscillator with an odd number of NOR-gates greater than or equal to three. Each of the NOR-gates has first and second input terminals, a voltage supply terminal, and an output terminal. The first input terminals of all the NOR-gates are interconnected, and each of the NOR-gates has its output terminal connected to the second input terminal of an immediately adjacent one of the NOR-gates. Also included is a voltage supply and control block. During a stress mode, this block applies a stress enable signal to the interconnected first input terminals, and an increased supply voltage to the voltage supply terminals. During a measurement mode, this block applies ground voltage to the interconnected first input terminals, and a normal supply voltage to the voltage supply terminals.

In another exemplary embodiment, according to another aspect of the invention, a NAND-gate based ring oscillator circuit for measurement of positive bias temperature instability effect includes a ring oscillator with an odd number of NAND-gates greater than or equal to three. Each of the NAND-gates has first and second input terminals, a voltage supply terminal, and an output terminal. The first input terminals of all the NAND-gates are interconnected. Each of the NAND-gates has its output terminal connected to the second input terminal of an immediately adjacent one of the NAND-gates. Also included is a voltage supply and control block. During a stress mode, this block applies a stress enable signal to the interconnected first input terminals, and an increased supply voltage to the voltage supply terminals. During a measurement mode, this block applies normal supply voltage to the interconnected first input terminals, and a normal supply voltage to the voltage supply terminals.

In yet another exemplary embodiment according to yet another aspect of the invention, a ring oscillator circuit for measurement of negative bias temperature instability effect and positive bias temperature instability effect includes a ring oscillator with first and second rails and an odd number of repeating circuit structures greater than or equal to three. Each of the repeating circuit structures includes an input terminal and an output terminal, a first p-type transistor, a first n-type transistor, and repeating-circuit-structure control circuitry. The first p-type transistor has a gate coupled to the input terminal, a first drain-source terminal coupled to the first rail, and a second drain source terminal selectively coupled to the output terminal. The first n-type transistor has a gate coupled to the input terminal, a first drain-source terminal coupled to the second rail, and a second drain source terminal selectively coupled to the output terminal. Each of the repeating circuit structures has its output terminal connected to the input terminal of an immediately adjacent one of the repeating circuit structures. Also included in the circuit is a voltage supply and control block coupled to the ring oscillator and configured to cooperate with the repeating-circuit-structure control circuitry, as follows. During a negative bias temperature instability effect direct current test mode, a stress voltage is applied to the first rail and a ground to the second rail, and the first p-type transistor of each of the repeating circuit structures is stressed. During a positive bias temperature instability effect direct current test mode, a stress voltage is applied to the first rail and a ground to the second rail and the first n-type transistor of each of the repeating circuit structures is stressed. During a measurement mode, a nominal supply voltage is applied to the first rail and a ground to the second rail, and the second drain source terminals of the first n-type transistors and the first p-type transistors are coupled to the output terminals, such that each of the repeating circuit structures functions as an inverter.

In a further exemplary embodiment according to a further aspect of the invention, a ring oscillator circuit for measurement of negative bias temperature instability effect and positive bias temperature instability effect includes a ring oscillator. The ring oscillator includes an odd number of main inverters greater than or equal to three. Each of the main inverters has an input terminal, an output terminal, a voltage supply terminal, a p-type transistor, and an n-type transistor. A plurality of first paths selectively couple the output terminals of the main inverters to the input terminals of adjacent ones of the main inverters. A plurality of inverting second paths selectively couple the output terminals of the main inverters to the input terminals of adjacent ones of the main inverters. Also included is a voltage supply and control block coupled to the ring oscillator and configured to effectuate the following. During a negative bias temperature instability effect test mode, the input of a first one of the inverters is grounded, a stress voltage is applied to the voltage supply terminals of the main inverters, the first paths are opened, and the second paths are operative to invert a signal appearing at the output terminals of the main inverters to obtain an inverted signal, and to supply the inverted signal to the input terminals of the adjacent ones of the main inverters, thus stressing the p-type transistors. During a positive bias temperature instability effect test mode, the stress voltage is applied to the voltage supply terminals of the main inverters and the input of the first one of the inverters, the first paths are opened, and the second paths are operative to invert a signal appearing at the output terminals of the main inverters to obtain an inverted signal, and to supply the inverted signal to the input terminals of the adjacent ones of the main inverters, thus stressing the n-type transistors. During a measurement mode, a nominal voltage is applied to the voltage supply terminals of the main inverters, the first paths are conductive and the second paths are opened.

In an even further exemplary embodiment according to an even further aspect of the invention, a circuit for measuring bias temperature instability effect in pass gates includes a ring oscillator. The oscillator has an odd number of inverters greater than or equal to three. Each of the inverters has an input terminal, an output terminal, and first and second voltage supply terminals. The first voltage supply terminals of all the inverters are coupled, and the second voltage supply terminals of all the inverters are coupled. A plurality of pass transistors are configured as the pass gates, coupling the output terminals of the inverters to the input terminals of adjacent ones of the inverters. A plurality of supplemental transistors selectively couple the inputs of the inverters to (i) the second voltage supply terminals, in a case when the pass transistors are p-type, and (ii) the first voltage supply terminals, in a case when the pass transistors are n-type. A voltage supply and control block is coupled to the ring oscillator and configured such that in a stress mode, the pass transistors are stressed and the supplemental transistors are on; and in a measurement mode, the pass transistors operate with nominal voltage and the supplemental transistors are off.

In still another aspect, the invention includes design structures for circuits of the kind described.

One or more embodiments of the present invention may be realized in the form of an integrated circuit.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

One or more embodiments of the invention provide test structures and schemes that enable efficient characterization and analysis of both PBTI and NBTI effects, and their impact on circuits. Since the dependencies, mechanisms and magnitudes of PBTI and NBTI may differ, it is advantageous to be able to isolate the impact of each of these two effects.

In one or more embodiments, the simplicity of the ring-oscillator based configuration is maintained, while the two types of devices (n and p) are isolated using simple switches and pre-bias circuits. In measurement mode, these switches are closed and pre-bias circuits are disabled, so that the circuit operates as a ring-oscillator. In stress mode, these switches are open; thereby eliminating the interaction between the two types of stressed devices, while the requisite stress voltages are applied via the pre-bias circuits. One or more embodiments of the invention isolate the contributions of the two effects; this isolation is believed to be advantageous since, in the prior-art ring oscillator approach, the difference in frequency is in fact influenced by the degradation of PFETs due to NBTI and of NFETs due to PBTI, during the stress.

Figure 2:
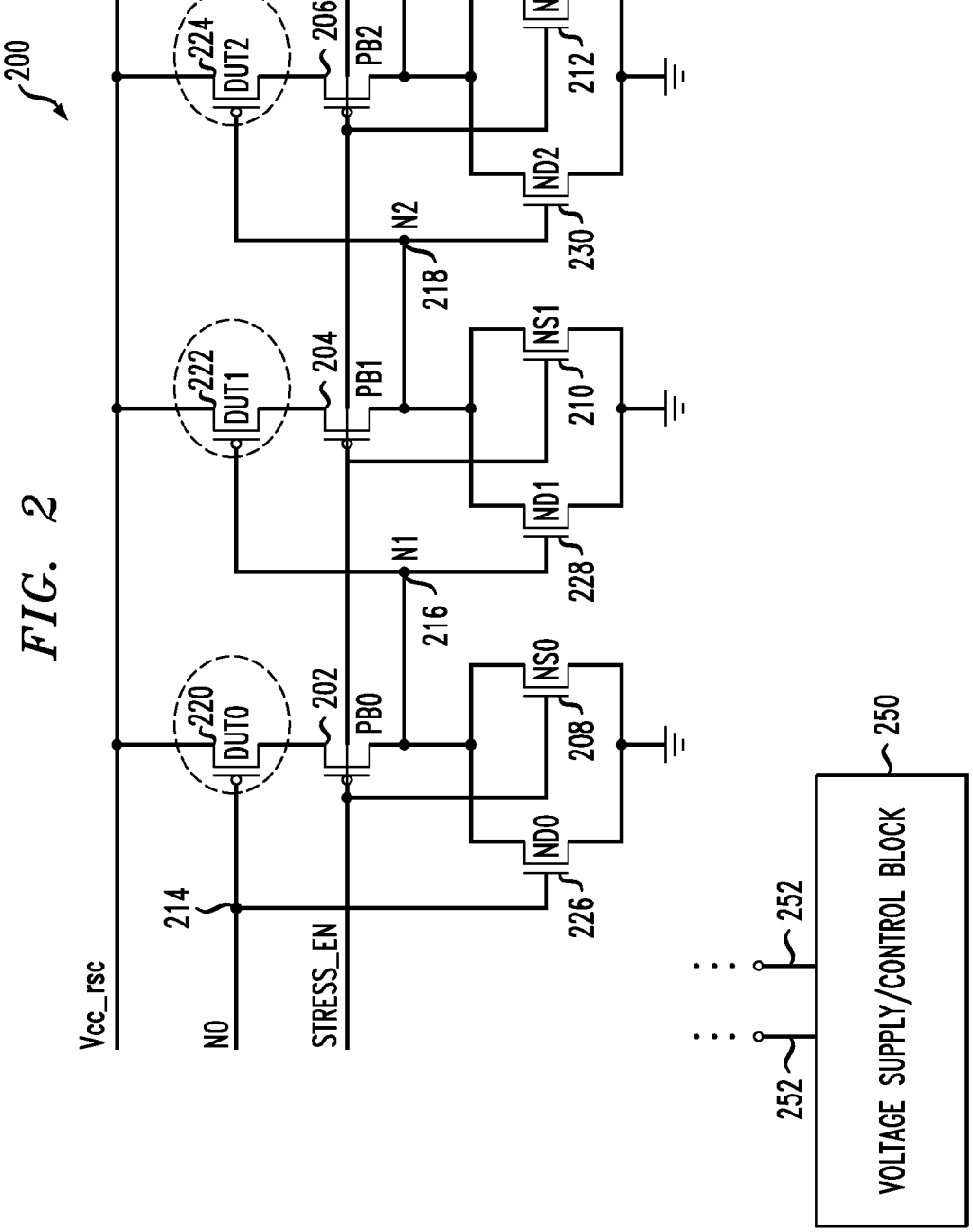
FIG. 2 shows a NOR-gate based ring oscillator for NBTI measurement, according to an aspect of the invention.

For NBTI measurement, one significant requirement is to isolate the PMOS devices under stress mode. In one or more embodiments of the invention, this is achieved using a NOR-gate based ring oscillator system 200, wherein the devices DUT (device under test), PB and ND impact the ring-oscillator delay, as depicted in FIG. 2. Note that while FIG. 2 depicts three NOR gates numbered 0, 1, 2, any odd number greater than or equal to three can be employed. Accordingly, reference is made to an "Nth" device in the following discussion. Note also that feedback from the last gate's output to the first gate's input is not shown, for illustrative convenience (true throughout the specification).

In stress mode, the Stress_En signal is asserted and the supply voltage $V_{CC\_rsc}$ is increased. This turns off the second device in the PMOS stack (i.e. $PB_0$ thru $PB_N$), numbered 202, 204, 206, and ensures that the parallel NFET devices (i.e. $NS_0$ thru $NS_N$), numbered 208, 210, 212, are turned on. This forces all the gate-output nodes ($N_0$ thru $N_N$), numbered 214, 216, 218, to a logic zero, thereby stressing all the PFET devices, $DUT_0$ thru $DUT_N$, numbered 220, 222, 224 (for clarity, note that with regard to the gate output nodes ($N_0$ thru $N_N$), N is the output of gate 0, N2 is the output of gate 1, and N0 is the output of gate 2). The corresponding NFET devices $ND_0$ through $ND_N$, numbered 226, 228, 230, are not stressed. While the devices $NS_0$ thru $NS_N$ 208, 210, 212, also experience stress in this scenario, they are turned off during measurement mode and do not impact the frequency of the ring-oscillator system 200. Thus, the difference between pre- and post-stress frequency is only a function of the NBTI effect on the PFET devices $PB_0$ thru $PB_N$, 202, 204, 206, and is independent of PBTI effects.

Figure 1:
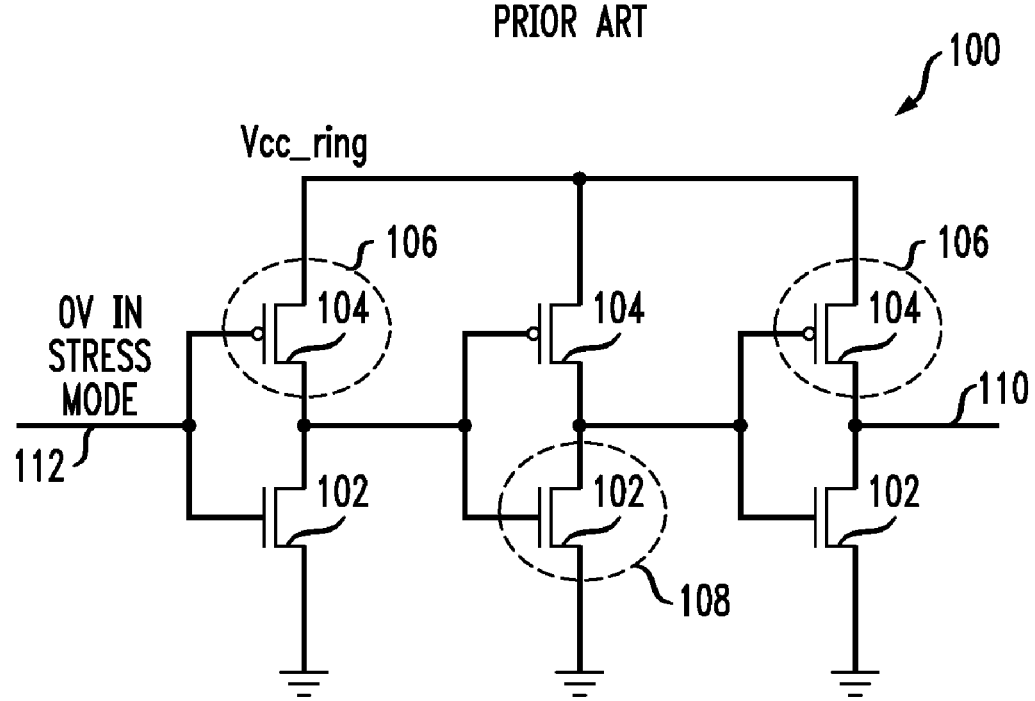
FIG. 1 shows a ring oscillator, as known from the prior art.

In the measurement mode, the Stress_En signal is de-asserted (that is, block 250 applies a zero or ground voltage to the terminal labeled STRESS_EN), and the circuit 200 operates as a simple ring-oscillator. A normal supply voltage is applied to the voltage supply terminals (i.e., upper rail) in this mode. The devices $PB_0$ to $PB_N$, 202, 204, 206, are sized larger than the DUTs 220, 222, 224, to increase and preferably maximize the NBTI effect on the delay and thus improve the sensitivity of the ring-oscillator 200 to NBTI-induced degradation. In addition, the sensitivity of the system is better than the conventional ring oscillator based scheme, since all the PFET devices experience stress during the stress mode, as opposed to the conventional ring oscillator based scheme, where only alternate PFET devices experience stress, as shown in FIG. 1.

Also shown in FIG. 2 is voltage supply/control block 250 with a plurality of terminals 252. Block 250 is coupled to the circuit 200, as suggested by the ellipses, and applies the correct voltages to each terminal for stress, measurement, and so on. Each circuit depicted herein can be provided with a similar voltage supply/control block, but such block is omitted from the remainder of the figures for brevity and illustrative convenience.

Figure 3:
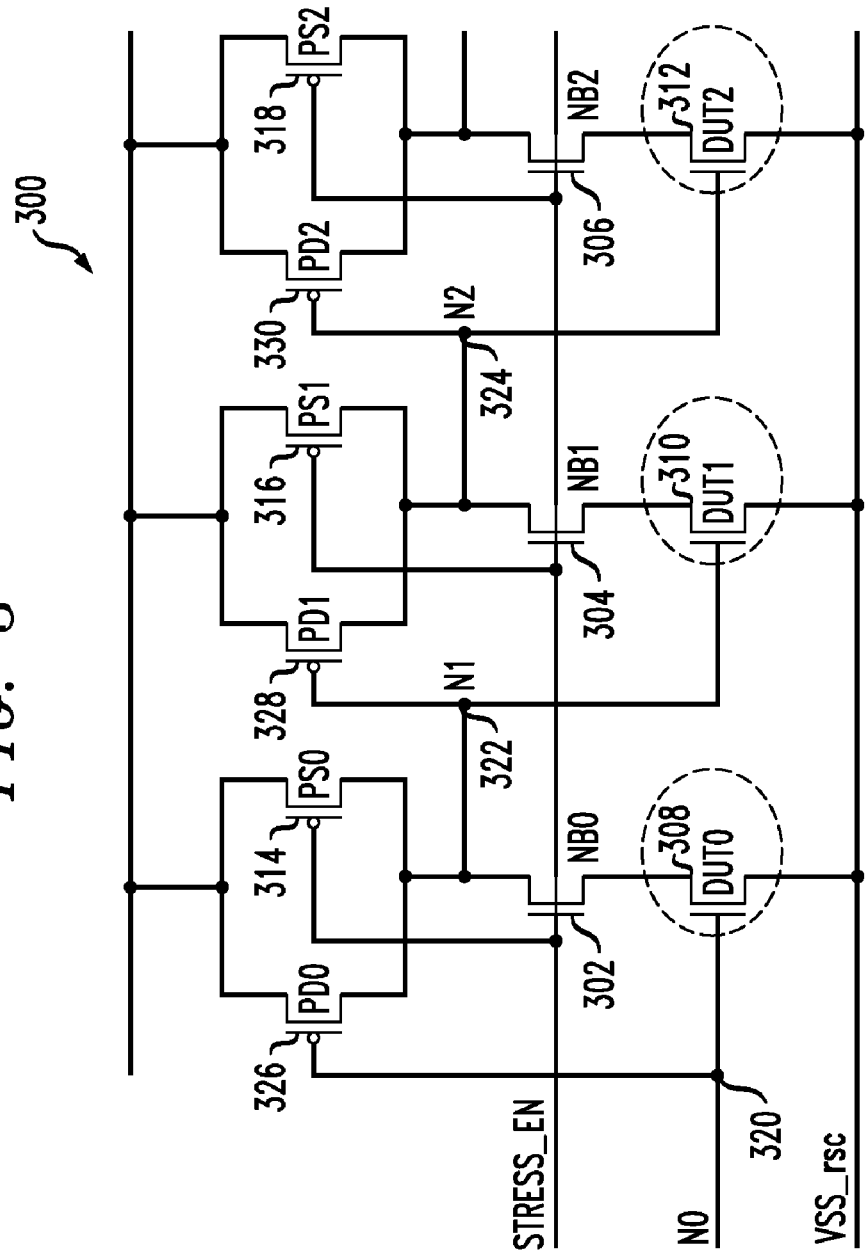
FIG. 3 shows a NAND-gate based ring oscillator for PBTI measurement, according to another aspect of the invention.

A complementary NAND-gate based ring-oscillator system 300 can be used for PBTI measurement, as illustrated in FIG. 3. Here a two-high NFET stack is used, with the top device in the stack, $NB_0$ through $NB_N$, numbered 302, 304, 306, turned off in stress mode thereby isolating the DUTs $DUT_0$ through $DUT_N$, numbered 308, 310, 312. The parallel PFET devices $PS_0$ thru $PS_N$, numbered 314, 316, 318, ensure that the gate-output nodes ($N_0$ thru $N_N$), numbered 320, 322, 324 are at a logical high, thereby stressing the DUTs 308, 310, 312 (for clarity, note that with regard to the gate output nodes ($N_0$ thru $N_N$), N1 is the output of gate 0, N2 is the output of gate 1, and N0 is the output of gate 2). These parallel PFET devices do experience NBTI stress, but do not impact the frequency of the ring-oscillator 300 during measurement mode, since they are turned off P-type devices PD0 through PDN are numbered 326, 328, and 330. Thus, during stress mode, a block such as block 250 (not shown) applies the stress enable signal as shown (0 V, or ground, in this case), and an increased supply voltage to the top rail. During measurement mode, this block applies normal supply voltage to the STRESS_EN terminal, and a normal supply voltage to the top rail. To reiterate, in stress mode, the top rail (supply voltage rail) voltage is increased to the higher stress voltage and the lower rail (VSS_rsc in FIG. 3) voltage remains at ground. In stress mode, the STRESS_EN voltage is 0V (or ground). In measurement mode, the top rail voltage is reduced to normal supply voltage and VSS_rsc remains at 0V (or ground). The STRESS_EN voltage is normal supply voltage in the measurement node. There are sizing considerations analogous to FIG. 2, that is, the NBs should be sized larger than the DUTs to increase sensitivity to the positive bias temperature instability effect.

Figure 4:
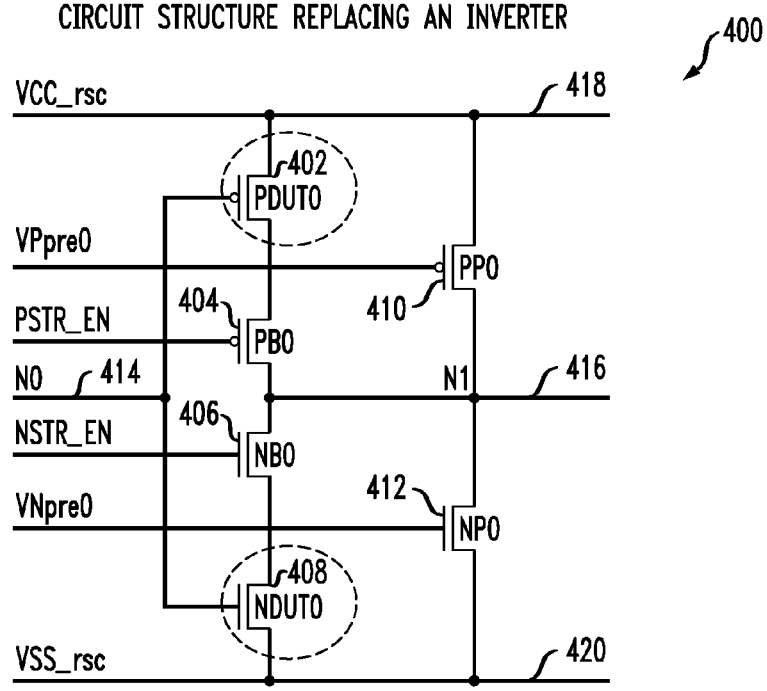
FIG. 4 depicts an embodiment of an inventive repeating unit that can be used for both NBTI and PBTI measurement.
Figure 5:
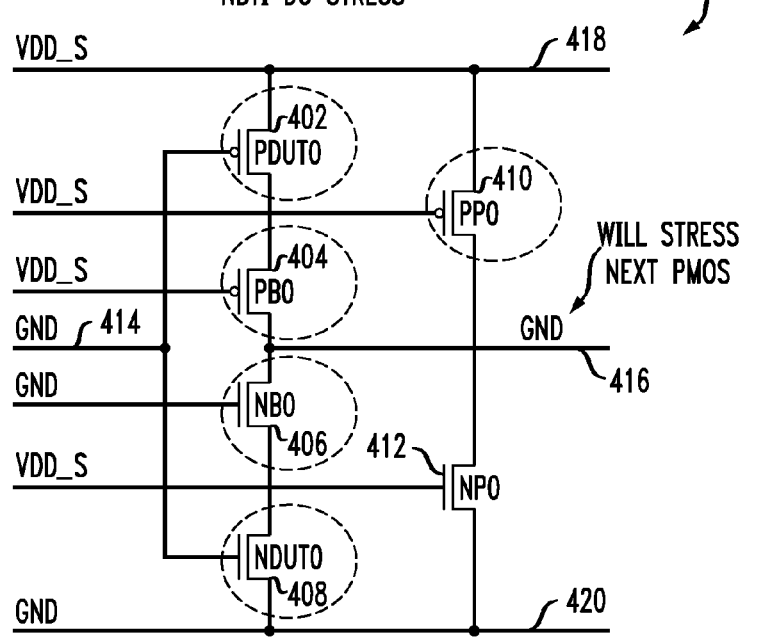
FIG. 5 shows the unit of FIG. 4 under NBTI DC stress.
Figure 6:
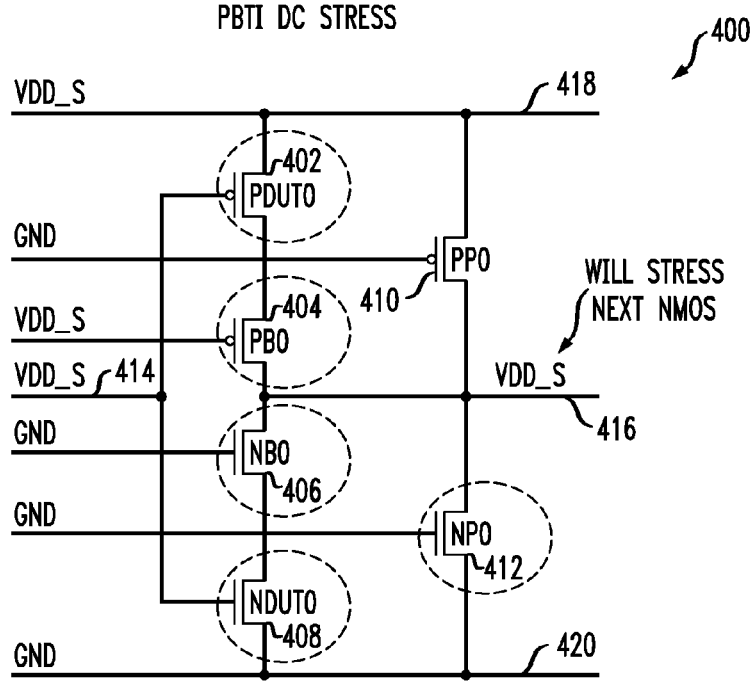
FIG. 6 shows the unit of FIG. 4 under PBTI DC stress.
Figure 7:
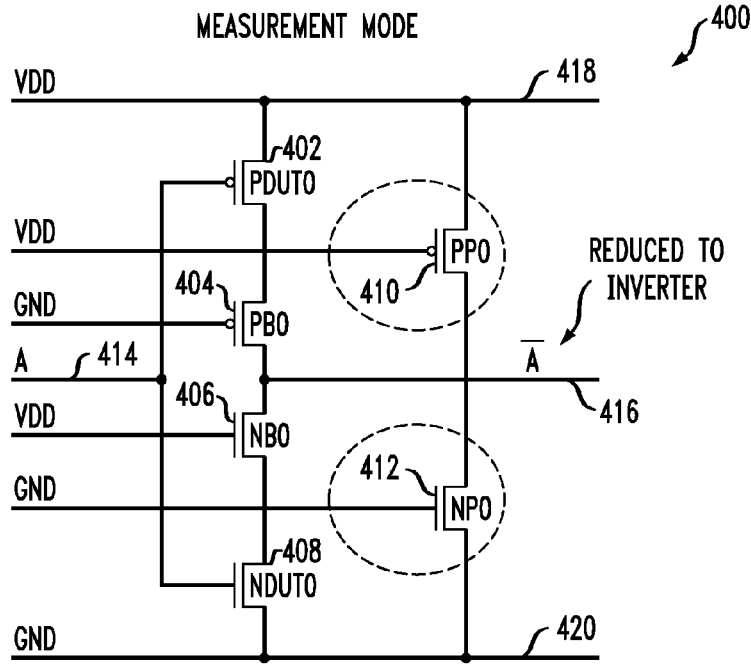
FIG. 7 shows the unit of FIG. 4 in measurement mode.

In one or more embodiments of the invention, the PBTI and NBTI measurement systems of FIGS. 2 and 3 can be combined, as shown in FIG. 4, into a single ring-oscillator system 400, using a two-high stack for both PFET and NFET devices, with parallel PFET and NFET devices 410, 412 that ensure the application of appropriate stress voltages to the DUTs in stress mode, as shown in FIGS. 5 and 6. Measurement mode is shown in FIG. 7. In particular, the repeating circuit structure 400 includes stacked PMOS device under test 402 and PMOS PB 404, as well as stacked NMOS NB 406 and NMOS device under test 408. N0 414 is the input and N1 416 is the output. The top and bottom rails are numbered, respectively, 418, 420. The extra devices used to provide isolation functionality are referred to as repeating-circuit-structure control circuitry, for example, devices 404, 406, 410, 412. The gates of all devices 404 may be interconnected to a p-stress enable terminal, the gates of all devices 406 may be interconnected to an n-stress enable terminal, the gates of all devices 410 may be connected to a p-parallel terminal, and the gates of all devices 412 may be connected to an n-parallel terminal.

In NBTI DC stress mode, as in FIG. 5, input 414 is grounded, and $V_{DD\_S}$, the elevated stress voltage, is applied to the top rail 418 and the gates of devices 404, 410, 412. Bottom rail 420 is also grounded, as is the gate of device 406.

This results in a ground appearing also on output 416, with devices 404, 406, 408, 410 off and device 402 stressed. The ground at 416 will also result in stressing the next PMOS device 402 in the next repeating structure 400.

In PBTI DC stress mode, as in FIG. 6, $V_{DD\_S}$ is applied to top rail 418 as well as input 414 and the gate of device 404, with bottom rail 420 and the gates of devices 406, 410 and 412 grounded. This results in $V_{DD\_S}$ appearing at output 416, so that the next NMOS device 408 in the next repeating structure 400 will also be stressed. Device 408 is stressed while devices 402, 404, 406 and 412 are off.

In measurement mode, as shown in FIG. 7, $V_{DD}$ is applied to top rail 418, as well as the gates of devices 406, 410, while bottom rail 420 and the gates of devices 404, 412 are grounded, reducing the structure to an inverter, where signal A applied at input 414 has its complement appear at output 416.

Figure 8:
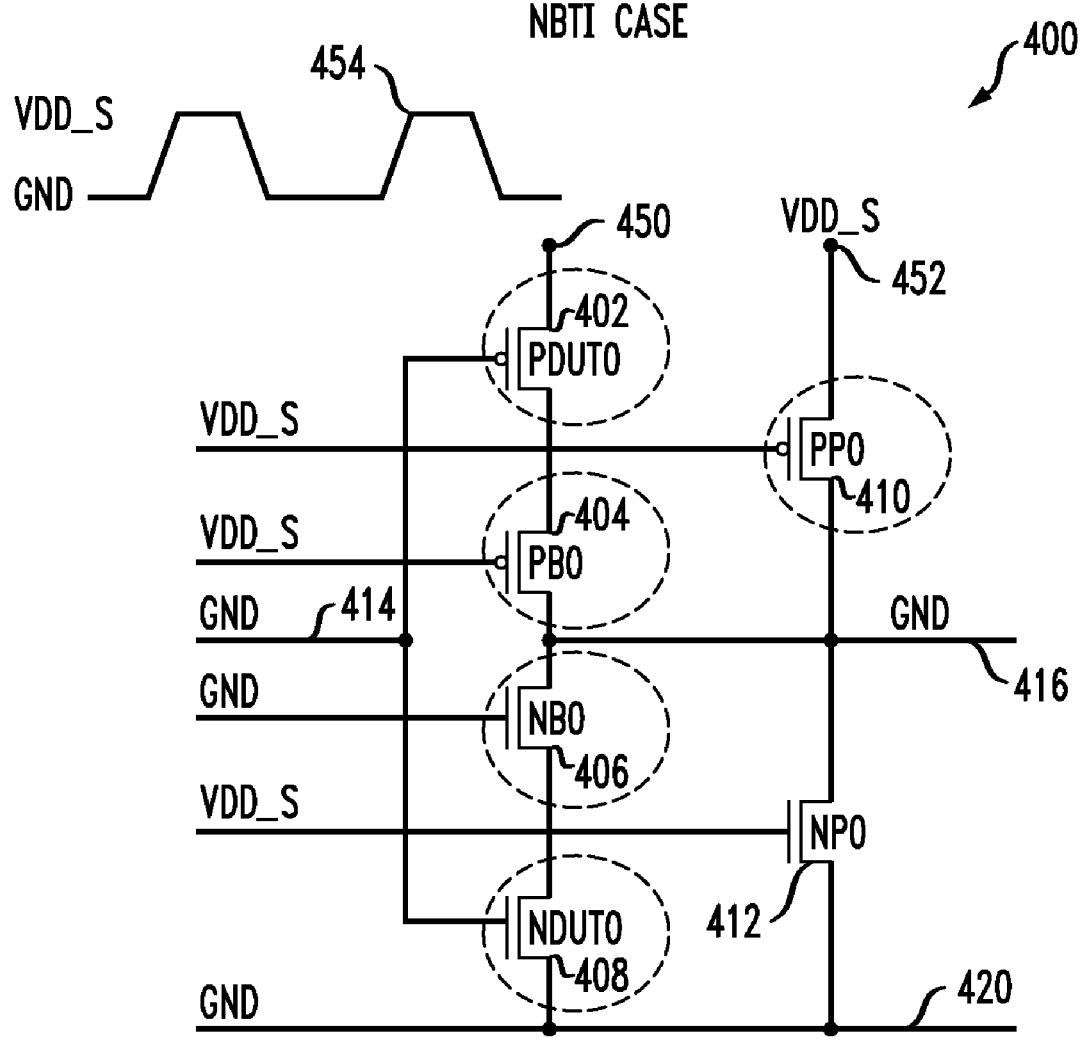
FIG. 8 shows the unit of FIG. 4 in NBTI source pulsing mode.

Up to this point, only DC stress conditions have been described. It can be seen that the DC stress voltage is applied to the gate of each DUT. In the embodiments discussed thus far, however, the AC stress voltage cannot be applied to the gate of each DUT since it will stress the PMOS and NMOS in the same inverter stage alternately. To address this issue, one or more embodiments of the invention may advantageously employ inventive "source pulsing." With reference to FIG. 8, AC stress can be applied to either the PMOS or the NMOS in an inverter stage by applying the stress to the source node of the PMOS only (for the NBTI case) or the source node of the NMOS only (for the PBTI case). FIG. 8 depicts the NBTI case, wherein input 414, bottom rail 420, and the gate of device 406 are grounded, while terminal 452 and the gates of devices 404, 410, 412 are maintained at $V_{DD\_S}$. Ground also appears at the output 416. Waveform 454 is applied at terminal 450, subjecting device 402 to AC stress. Devices 404, 406, 408, 410 are off. In the case shown in FIG. 8, the rail 418 can be formed from a test rail for applying signal 454 to 450 and a parallel rail for applying $V_{DD\_S}$ to 452.

Figure 20:
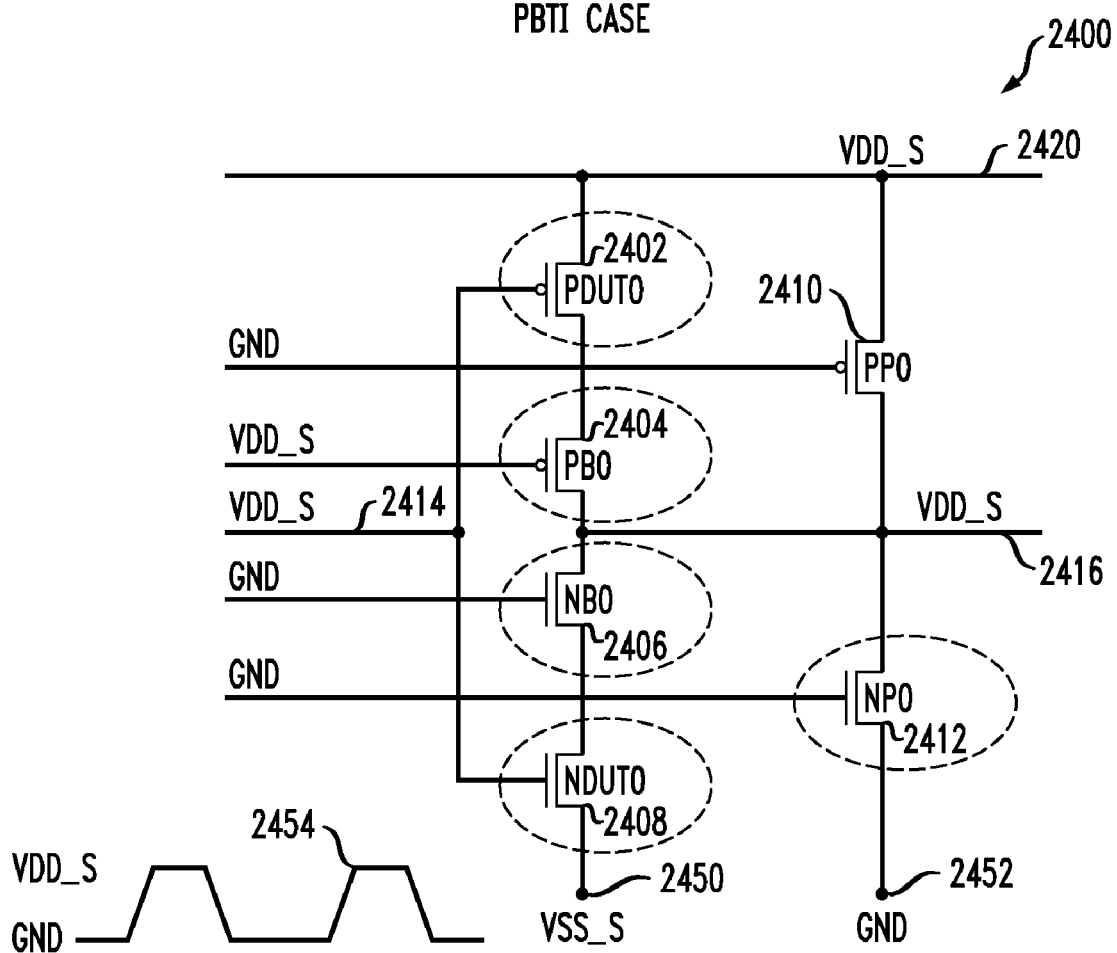
FIG. 20 shows the unit of FIG. 4 in PBTI source pulsing mode.

The PBTI case 2400 is shown in FIG. 20, during alternating current stress mode. The source node 2450 of NDUT0 2408 and the source node 2452 of NP0 2412 should be separated, just as the source node 450 of PDUT0 402 and the source node 452 of PP0 410 were separated for the NBTI case in FIG. 8. In the PBTI case, during alternating current stress mode, an alternating voltage 2454 is applied to 2450, DC stress voltage $V_{DD\_S}$ is applied to the gate of 2404 and rail 2420, while the gates of devices 2406, 2410, and 2412 are grounded, such that device 2408 is subject to alternating current stress. Devices 2402, 2404, 2406, and 2412 are off. The input is designated as 2414 and the output 2416 (elements in FIG. 20 are given the analogous number from FIG. 8, incremented by two thousand). In the case shown in FIG. 20, the rail 420 can be formed from a test rail for applying signal 2454 to 2450 and a parallel rail for grounding 2452.

Figure 9:
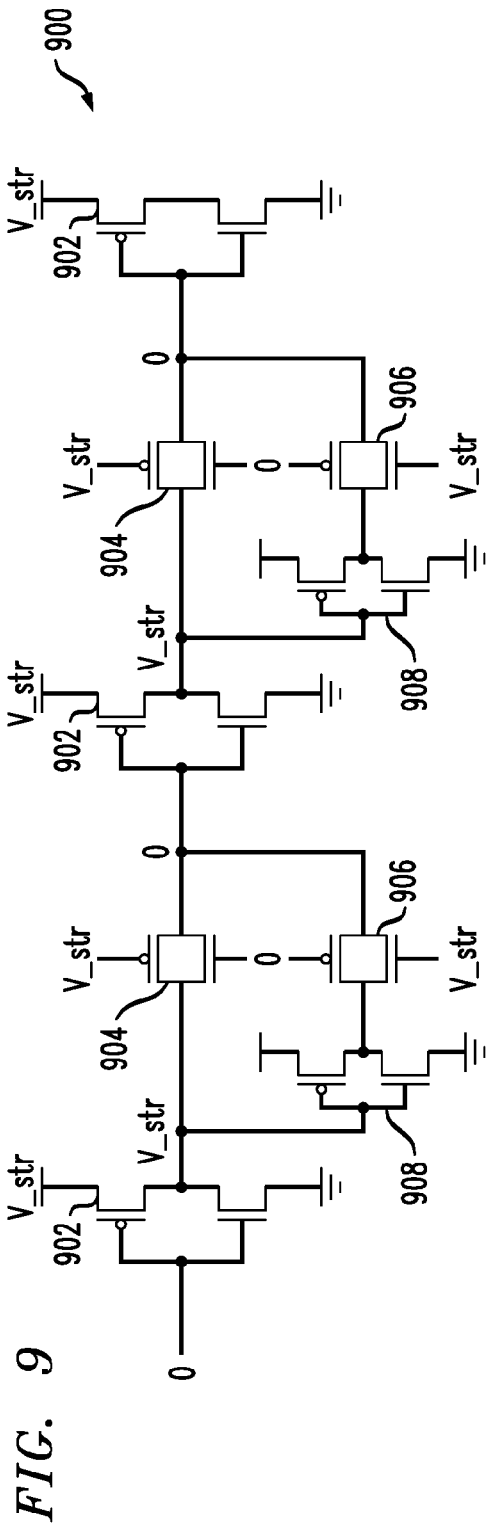
FIG. 9 depicts an exemplary embodiment of an isolated NBTI/PBTI measurement circuit, according to another aspect of the invention, in NBTI stress mode.

Another exemplary embodiment of an isolated NBTI/PBTI measurement circuit 900, according to another aspect of the invention, is shown in FIG. 9. In this embodiment, main inverters 902 are connected by upper pass gate structures 904, with a parallel lower path through lower inverters 908 and lower pass gate structures 906. In stress mode, the additional path (bottom pass-gates path 906, 908) enables all PMOSs or NMOSs to be stressed simultaneously, depending on the stress voltage input. The pass-gates 904 in the normal signal path have no stress during stress mode. FIG. 9 shows the NBTI stress mode. The top pass gates 904 are off and a zero logic level is applied to the input of the first main inverter 902. The output is fed to the first lower inverter 908, and passes through the first lower pass gate 906, which conducts. The second main inverter thus also has a logical zero input, and so on for each main inverter 902 in the chain. The PMOS devices in each main inverter 902 are thus stressed.

Figure 10:
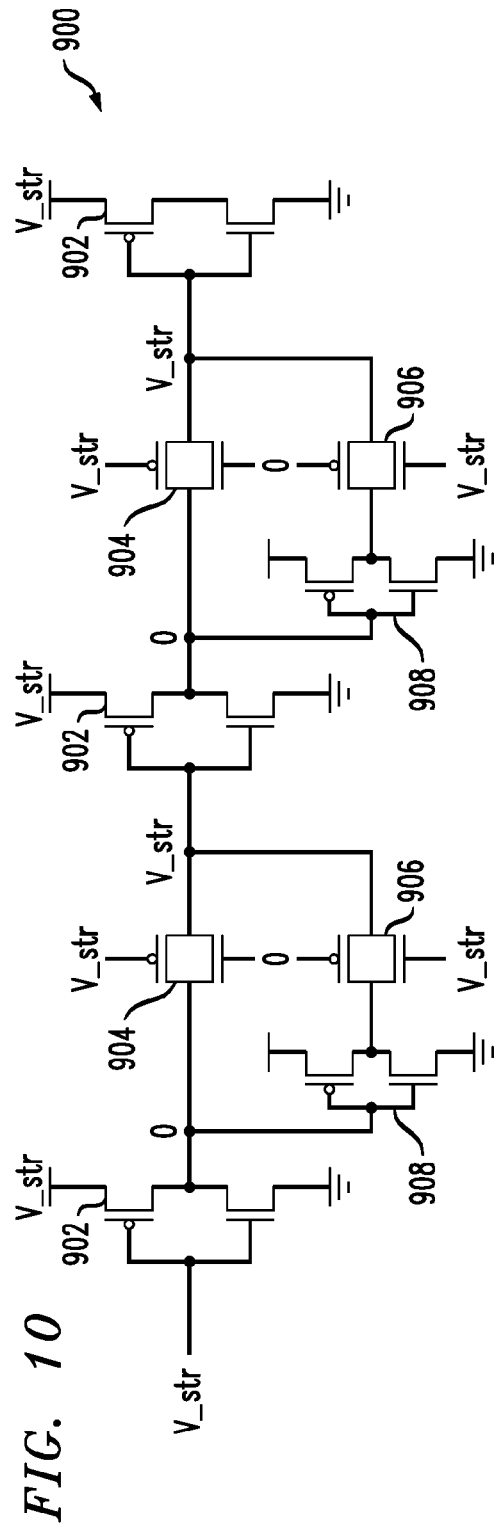
FIG. 10 depicts the circuit of FIG. 9 in PBTI stress mode.

FIG. 10 shows the PBTI stress mode for the circuit of FIG. 9. The top pass gates 904 are off and a stress voltage $V_{\_str}$ is applied to the input of the first main inverter 902. The output is fed to the first lower inverter 908, and passes through the first lower pass gate 906, which conducts. The second main inverter thus also has a stress voltage $V_{\_str}$ input, and so on for each main inverter 902 in the chain. The NMOS devices in each main inverter 902 are thus stressed.

Figure 11:
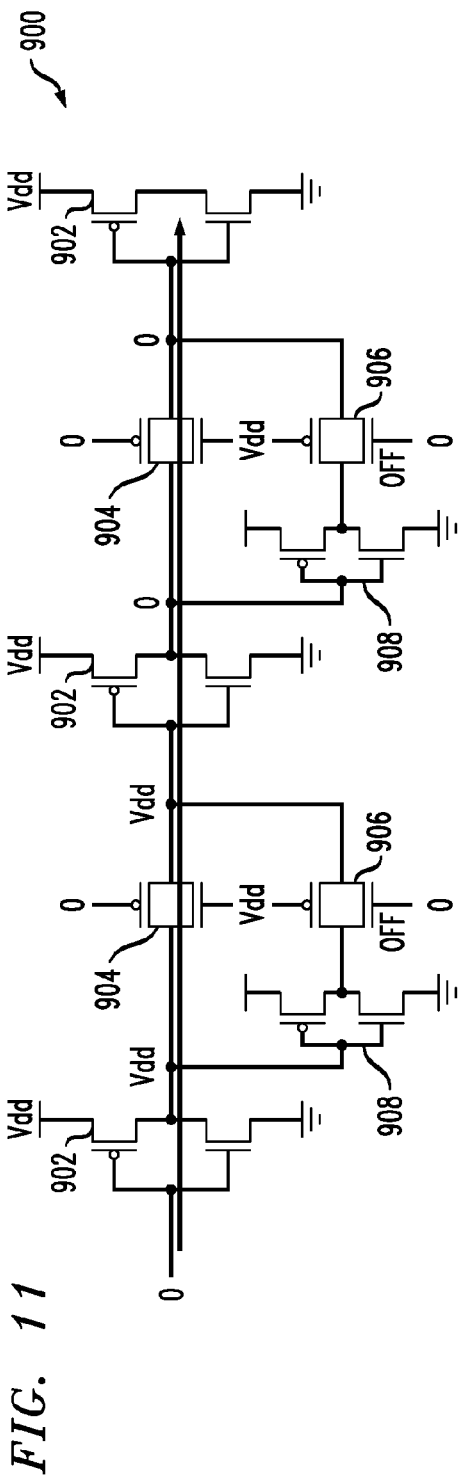
FIG. 11 depicts the circuit of FIG. 9 in measurement mode.

For measurement, the bottom path is cut off by opening lower pass gates 906 and a normal inverter chain is formed as shown in FIG. 11. Because the measurement is executed within a few micro seconds, the degradation of the pass-gate during measurement can be ignored.

Figure 12:
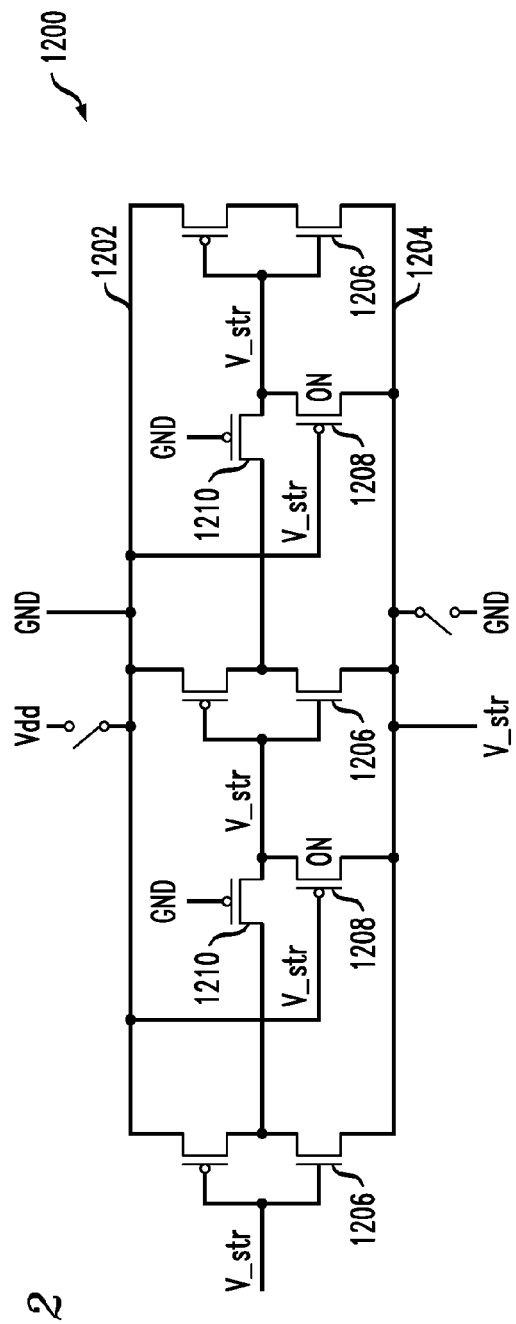
FIG. 12 depicts an exemplary embodiment of circuit for NBTI measurement in PMOS pass gates, according to yet another aspect of the invention, in NBTI stress mode

FIG. 12 shows an exemplary embodiment of circuit 1200 for stressing PMOS pass gates to ascertain the NBTI effect, according to an even further aspect of the invention. During stress, supply voltage node 1202 is connected to GND and ground node 1204 is connected to V_str. The inverters 1206 operate like buffers with voltage drop. This voltage drop is compensated for by the PMOS connection 1208 from the internal node to ground node 1204. These devices 1208 have no impact during measurement because they are turned off, as discussed below with regard to FIG. 13. The current paths formed by these PMOS devices 1208 also tend to reduce or eliminate gate leakage. During stress mode, the PMOS devices 1208, whose gates are connected to supply rail 1202, are turned on, keeping the drain and source voltage of the PMOS pass gates 1210 equal to $V_{\_str}$. Even if there is gate leakage current, the current path formed by the PMOS devices 1208 when they are turned on is much stronger than gate leakage, which keeps the drain and source voltage of the PMOS pass gates 1210 equal to $V_{\_str}$. Hence, stress voltage can be accurately controlled.

Figure 13:
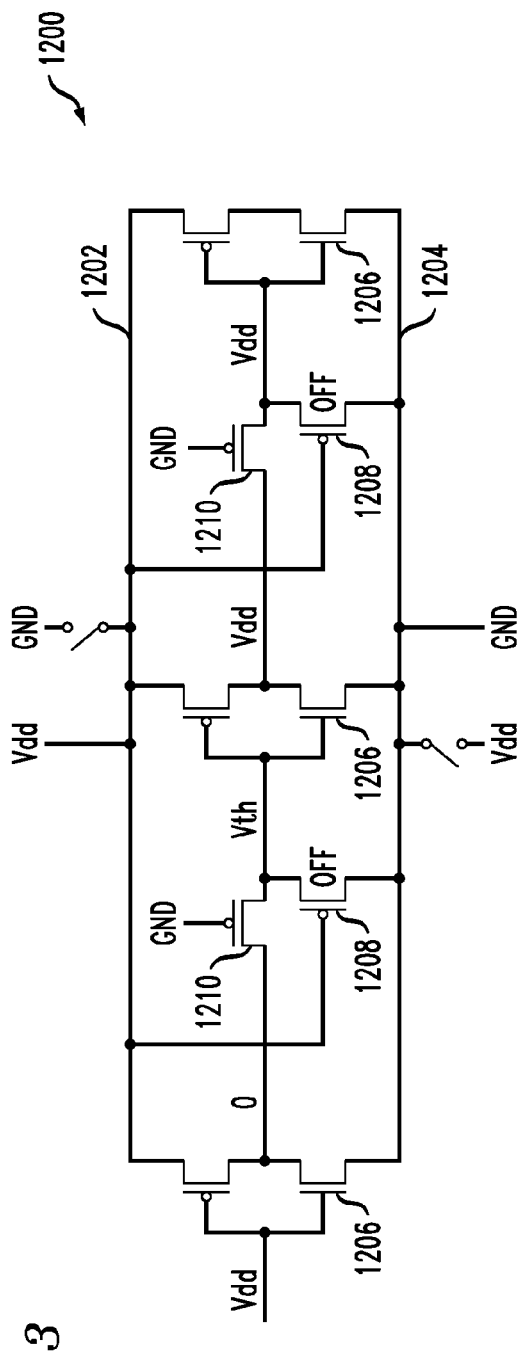
FIG. 13 depicts the circuit of FIG. 12 in NBTI measurement mode.

FIG. 13 shows the circuit 1200 during measurement. By connecting the supply voltage node 1202 back to VDD and the ground node 1204 to GND, devices 1208 are off, gates 1210 still conduct, and inverters 1206 form a ring-oscillator.

Figure 14:
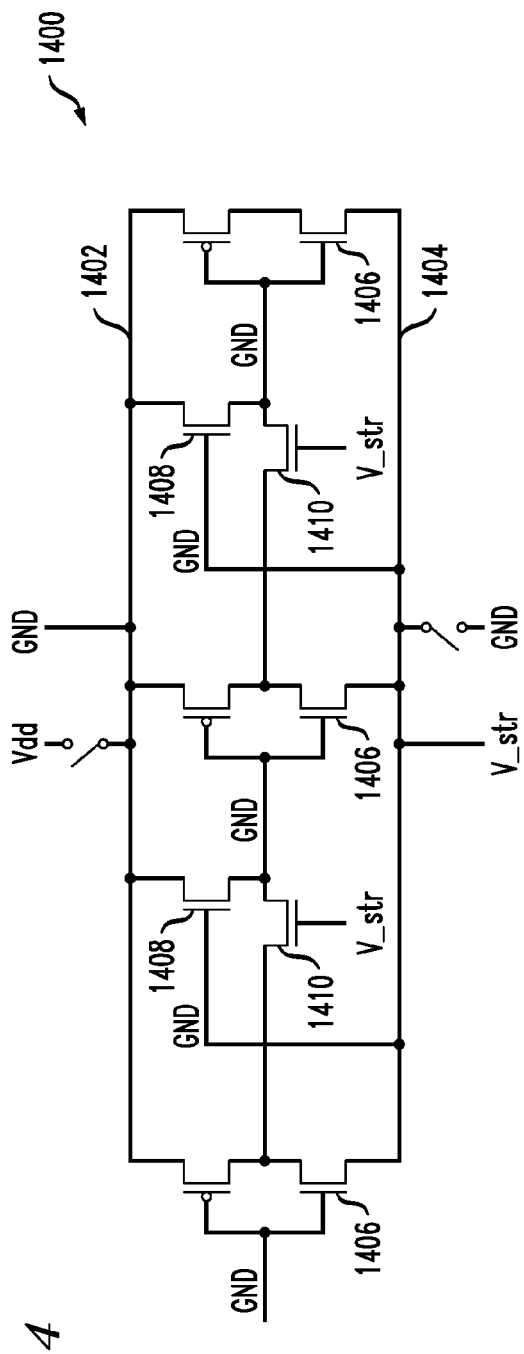
FIG. 14 depicts an exemplary embodiment of circuit for PBTI measurement in NMOS pass gates, according to still another aspect of the invention, in PBTI stress mode.
Figure 15:
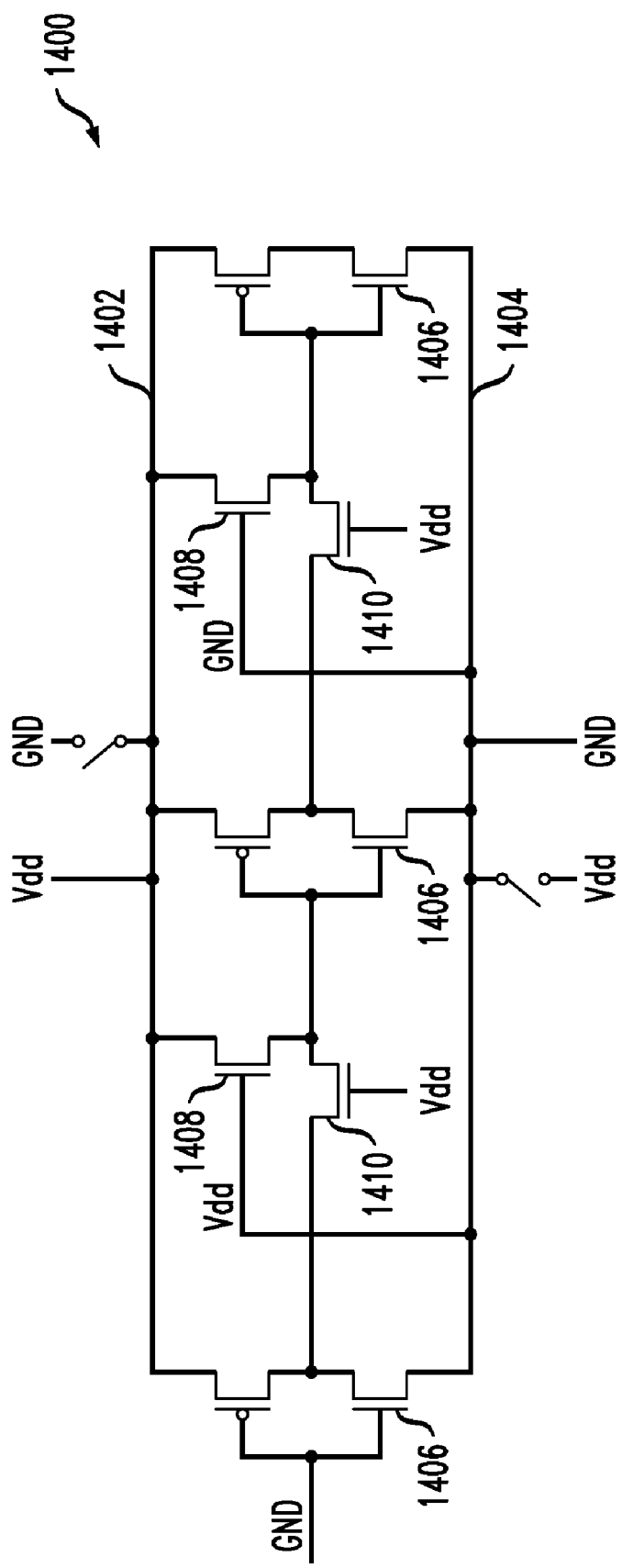
FIG. 15 depicts the circuit of FIG. 14 in PBTI measurement mode.

FIGS. 14 and 15 are analogous to FIGS. 12 and 13, but for measurement of the PBTI effect in NMOS pass-gates. During stress, as in FIG. 14, supply voltage node 1402 of circuit 1400 is connected to GND and ground node 1404 is connected to $V_{\_str}$. The inverters 1406 operate like buffers with voltage drop. This voltage drop is compensated for by the NMOS connection 1408 from the internal node to the voltage supply node 1402. These devices 1408 have no impact during measurement because they are turned off, as discussed below with regard to FIG. 15. The current paths formed by these NMOS devices 1408 also tend to reduce or eliminate gate leakage. During stress mode, the NMOS devices 1408, whose gates are connected to ground rail 1404, are turned on, keeping the drain and source voltage of the NMOS pass gates 1410 equal to ground. (Even if there is gate leakage current, the current path formed by the NMOS devices 1408 when they are turned on is much stronger than gate leakage, which keeps the drain and source voltage of the NMOS pass gates 1410 equal to ground.) Hence, stress voltage can be accurately controlled.

FIG. 15 shows the circuit 1400 during measurement. By connecting the supply voltage node 1402 back to VDD and the ground node 1404 to GND, devices 1408 are off, gates 1410 still conduct, and inverters 1406 form a ring-oscillator.

Figure 16:
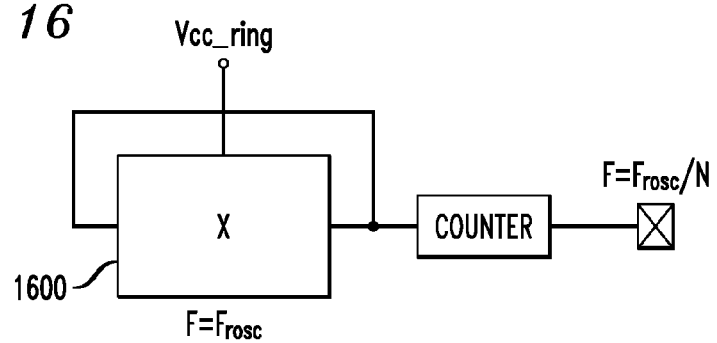
FIGS. 16-18 depict non-limiting exemplary applications of one or more embodiments of the invention.
Figure 17:
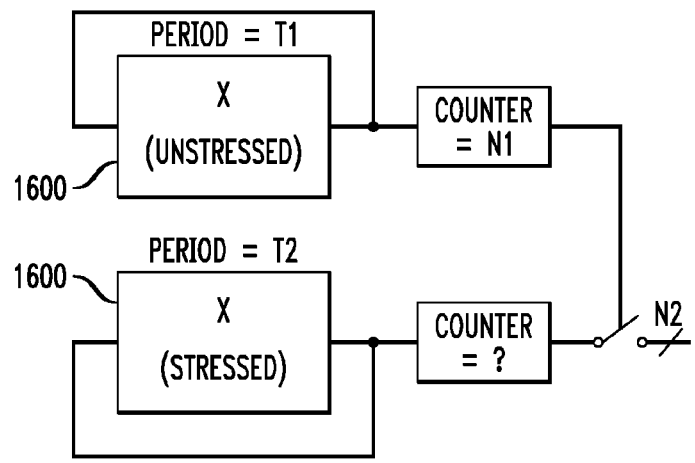
Figure 18:
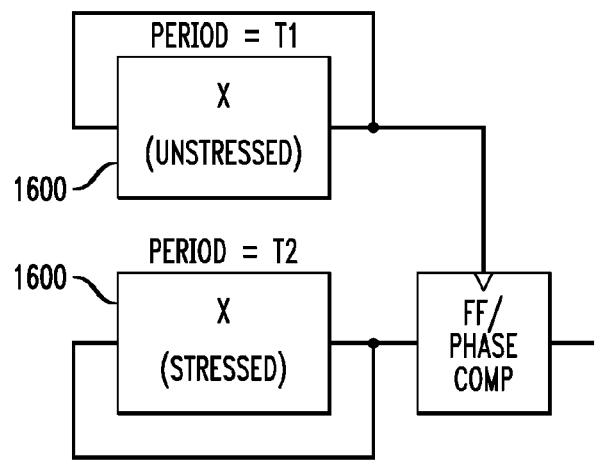

The embodiments of FIGS. 2-15 and 20, or other embodiments, can be used to replace prior-art simple ring oscillator configurations, or other read-out circuit configurations, as shown in FIGS. 16-18, without need for any change to the read-out circuitry. In each case, an inventive embodiment, labeled "X" or 1600, is substituted for another circuit such as a conventional ring oscillator circuit. In FIG. 16, inventive circuit 1600 is substituted for a ring oscillator critical path replica in the approach of V. Reddy et al, "Impact of Negative Bias Temperature Instability on Digital Circuit Reliability," as presented at IRPS 2002. In FIG. 17, inventive circuit 1600 is substituted for stressed and unstressed ring oscillator critical path replicas in a counter based measurement approach. In FIG. 18, inventive circuit 1600 is substituted for stressed and unstressed ring oscillator critical path replicas in phase comparator based measurement, as per T. Kim et al., "Silicon Odometer: An On-Chip Reliability Monitor for Measuring Frequency Degradation of Digital Circuits," presented at the 2007 VLSI symposium.

One exemplary advantage of one or more embodiments of the invention is the ability to measure the impact of PBTI- and NBTI-based degradation independently, while maintaining the simplicity of the ring-oscillator based system and its associated read-out circuitry. One or more embodiments also easily lend themselves to both AC and DC stress modes, and an analysis of stress frequency, duration, temperature and voltage on the degradation of each type of device. The DUT can be replaced by more complex structures if required to understand the impact of these degradations on stacked-circuit configurations.

Circuits according to one more aspects of the present invention may be realized as integrated circuits; thus, at least a portion of the techniques of one or more aspects or embodiments of the present invention described herein may be implemented in an integrated circuit. In forming integrated circuits, a plurality of identical die are typically fabricated in a repeated pattern on a surface of a semiconductor wafer. Each die can include one or more of the circuits described herein, and may include other structures or circuits, or circuits having other types of cells. The individual die are cut or diced from the wafer, then packaged as an integrated circuit. A person of skill in the art will know how to dice wafers and package die to produce integrated circuits. Integrated circuits so manufactured are considered part of the present invention. Circuits as described above can be part of the design for an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end applications to advanced computer products having a display, a keyboard or other input device, and a central processor.

Figure 19:
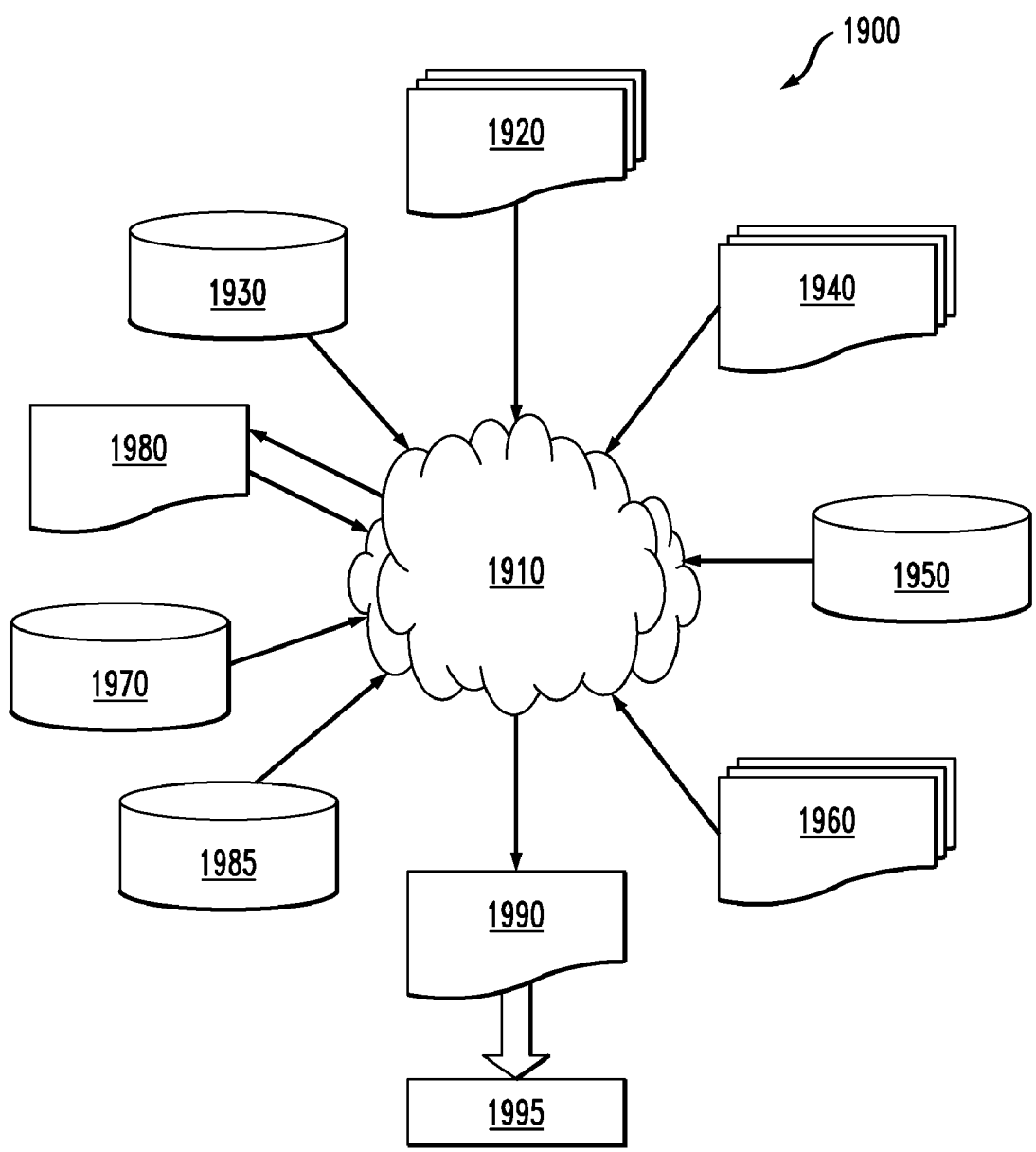
FIG. 19 is a flow diagram of a design process used in semiconductor design, manufacture, and/or test.

FIG. 19 shows a block diagram of an exemplary design flow 1900 used for example, in semiconductor design, manufacturing, and/or test. Design flow 1900 may vary depending on the type of IC being designed. For example, a design flow 1900 for building an application specific IC (ASIC) may differ from a design flow 1900 for designing a standard component. Design structure 1920 is preferably an input to a design process 1910 and may come from an IP provider, a core developer, or other design company or may be generated by the operator of the design flow, or from other sources. Design structure 1920 comprises, for example, an embodiment of the invention as shown in FIGS. 2-18 in the form of schematics or HDL, a hardware-description language (e.g., Verilog, VHDL, C, etc.). Design structure 1920 may be contained on one or more machine readable media. For example, design structure 1920 may be a text file or a graphical representation of an embodiment of the invention as shown in FIGS. 2-18. Design process 1910 preferably synthesizes (or translates) an embodiment of the invention as shown in FIGS. 2-18 into a netlist 1980, where netlist 1980 is, for example, a list of wires, transistors, logic gates, control circuits, I/O, models, etc. that describes the connections to other elements and circuits in an integrated circuit design and recorded on at least one machine readable medium. This may be an iterative process in which netlist 1980 is re-synthesized one or more times depending on design specifications and parameters for the circuit.

Design process 1910 may include using a variety of inputs; for example, inputs from library elements 1930 which may house a set of commonly used elements, circuits, and devices, including models, layouts, and symbolic representations, for a given manufacturing technology (e.g., different technology nodes, 32 nm, 45 nm, 90 nm, etc.), design specifications 1940, characterization data 1950, verification data 1960, design rules 1970, and test data files 1985 (which may include test patterns and other testing information). Design process 1910 may further include, for example, standard circuit design processes such as timing analysis, verification, design rule checking, place and route operations, etc. One of ordinary skill in the art of integrated circuit design can appreciate the extent of possible electronic design automation tools and applications used in design process 1910 without deviating from the scope and spirit of the invention. The design structure of the invention is not limited to any specific design flow.

Design process 1910 preferably translates an embodiment of the invention as shown in FIGS. 2-18, along with any additional integrated circuit design or data (if applicable), into a second design structure 1990. Design structure 1990 resides on a storage medium in a data format used for the exchange of layout data of integrated circuits and/or symbolic data format (e.g. information stored in a GDSII (GDS2), GLI, OASIS, map files, or any other suitable format for storing such design structures). Design structure 1990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 2-18. Design structure 1990 may then proceed to a stage 1995 where, for example, design structure 1990: proceeds to tape-out, is released to manufacturing, is released to a mask house, is sent to another design house, is sent back to the customer, etc.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope of spirit of the invention.

What is claimed is:

1. A NOR-gate based ring oscillator circuit for measurement of negative bias temperature instability effect, said circuit comprising:
   a ring oscillator comprising an odd number of NOR-gates, said odd number being at least three, each of said NOR-gates having first and second input terminals, a voltage supply terminal, and an output terminal, said first input terminals of all said NOR-gates being interconnected, each of said NOR-gates having its output terminal connected to said second input terminal of an immediately adjacent one of said NOR-gates; and
   a voltage supply and control block configured to apply:
      during a stress mode, a stress enable signal to said interconnected first input terminals, and an increased supply voltage to said voltage supply terminals; and
      during a measurement mode, ground voltage to said interconnected first input terminals, and a normal supply voltage to said voltage supply terminals.

2. A design structure embodied in a machine readable medium, said design structure comprising the NOR-gate based ring oscillator circuit of claim 1.

3. The circuit of claim 1, wherein:
   each of said NOR-gates comprises:
      a first p-type transistor having a gate coupled to said second input terminal, a first drain-source terminal coupled to said voltage supply terminal, and a second drain-source terminal;
      a second p-type transistor having a gate coupled to said first input terminal, a first drain-source terminal coupled to said second drain-source terminal of said first p-type transistor, and a second drain-source terminal coupled to said output terminal;
      a first n-type transistor having a gate coupled to said second input terminal, a first drain-source terminal coupled to said second drain-source terminal of said second p-type transistor, and a grounded second drain-source terminal; and
      a second n-type transistor having a gate coupled to said first input terminal, a first drain-source terminal coupled to said second drain-source terminal of said second p-type transistor, and a grounded second drain-source terminal; and
   said second p-type transistors are sized larger than said first p-type transistors to increase sensitivity to said negative bias temperature instability effect.

4. A design structure embodied in a machine readable medium, said design structure comprising the NOR-gate based ring oscillator circuit of claim 3.

5. A NAND-gate based ring oscillator circuit for measurement of positive bias temperature instability effect, said circuit comprising:
   a ring oscillator comprising an odd number of NAND-gates, said odd number being at least three, each of said NAND-gates having first and second input terminals, a voltage supply terminal, and an output terminal, said first input terminals of all said NAND-gates being interconnected, each of said NAND-gates having its output terminal connected to said second input terminal of an immediately adjacent one of said NAND-gates; and
   a voltage supply and control block configured to apply:
      during a stress mode, a stress enable signal to said interconnected first input terminals, and an increased supply voltage to said voltage supply terminals; and
      during a measurement mode, normal supply voltage to said interconnected first input terminals, and a normal supply voltage to said voltage supply terminals.

6. A design structure embodied in a machine readable medium, said design structure comprising the NAND-gate based ring oscillator circuit of claim 5.

7. The circuit of claim 5, wherein:
   each of said NAND-gates comprises:
      a first n-type transistor having a gate coupled to said second input terminal, a grounded first drain-source terminal, and a second drain-source terminal;
      a second n-type transistor having a gate coupled to said first input terminal, a first drain-source terminal coupled to said second drain-source terminal of said first n-type transistor, and a second drain-source terminal coupled to said output terminal;
      a first p-type transistor having a gate coupled to said second input terminal, a first drain-source terminal coupled to said second drain-source terminal of said second n-type transistor, and a second drain-source terminal coupled to said voltage supply terminal; and
      a second p-type transistor having a gate coupled to said first input terminal, a first drain-source terminal coupled to said second drain-source terminal of said second n-type transistor, and a second drain-source terminal coupled to said voltage supply terminal; and
   said second n-type transistors are sized larger than said first n-type transistors to increase sensitivity to said positive bias temperature instability effect.

8. A design structure embodied in a machine readable medium, said design structure comprising the NAND-gate based ring oscillator circuit of claim 7.

9. A ring oscillator circuit for measurement of at least one of negative bias temperature instability effect and positive bias temperature instability effect, said circuit comprising:
   a ring oscillator comprising first and second rails, and an odd number of repeating circuit structures, said odd number being at least three, each of said repeating circuit structures comprising:
      an input terminal and an output terminal;
      a first p-type transistor having a gate coupled to said input terminal, a first drain-source terminal coupled to said first rail, and a second drain source terminal selectively coupled to said output terminal;
      a first n-type transistor having a gate coupled to said input terminal, a first drain-source terminal coupled to said second rail, and a second drain source terminal selectively coupled to said output terminal; and
      repeating-circuit-structure control circuitry;
   wherein each of said repeating circuit structures has its output terminal connected to said input terminal of an immediately adjacent one of said repeating circuit structures; and a voltage supply and control block coupled to said ring oscillator and configured to cooperate with said repeating-circuit-structure control circuitry such that:
  during a negative bias temperature instability effect direct current stress mode, a stress voltage is applied to said first rail and a ground to said second rail, and said first p-type transistor of each of said repeating circuit structures is stressed;
  during a positive bias temperature instability effect direct current stress mode, a stress voltage is applied to said first rail and a ground to said second rail and said first n-type transistor of each of said repeating circuit structures is stressed; and
  during a measurement mode, a nominal supply voltage is applied to said first rail and a ground to said second rail, and said second drain source terminals of said first n-type transistors and said first p-type transistors are coupled to said output terminals, such that each of said repeating circuit structures functions as an inverter.

10. A design structure embodied in a machine readable medium, said design structure comprising the ring oscillator circuit of claim 9.

11. The circuit of claim 9, wherein:
  said ring oscillator further comprises a p-stress enable terminal, an n-stress enable terminal, a p-parallel terminal, an n-parallel terminal;
  said repeating-circuit-structure control circuitry comprises, for each of said repeating circuit structures:
    a second p-type transistor having a gate coupled to said p-stress enable terminal, a first drain-source terminal coupled to said second drain source terminal of said first p-type transistor, and a second drain source terminal coupled to said output terminal;
    a third p-type transistor having a gate coupled to said p-parallel terminal, a first drain-source terminal coupled to said first rail, and a second drain source terminal coupled to said output terminal;
    a second n-type transistor having a gate coupled to said n-stress enable terminal, a first drain-source terminal coupled to said second drain source terminal of said first n-type transistor, and a second drain source terminal coupled to said output terminal; and
    a third n-type transistor having a gate coupled to said n-parallel terminal, a first drain-source terminal coupled to said second rail, and a second drain source terminal coupled to said output terminal; and
  said voltage supply and control block is further configured to apply:
    during said negative bias temperature instability effect direct current stress mode, said stress voltage to said p-stress enable terminal, said p-parallel terminal, and said n-parallel terminal; and said ground to said input terminal of a first one of said repeating circuit structures, and said n-stress enable terminal;
    during a positive bias temperature instability effect direct current stress mode, said stress voltage to said p-stress enable terminal, and, said input terminal of said first one of said repeating circuit structures; and said ground to said n-stress enable terminal, said p-parallel terminal, and said n-parallel terminal; and
    during a measurement mode, said nominal supply voltage to said p-parallel terminal and said n-stress enable terminal; and said ground to said n-parallel terminal and said p-stress enable terminal.

12. A design structure embodied in a machine readable medium, said design structure comprising the ring oscillator circuit of claim 11.

13. The circuit of claim 11, wherein:
  said first rail comprises a first rail test rail coupled to said first drain-source terminals of said first p-type transistors and a first rail parallel rail coupled to said first drain-source terminals of said third p-type transistors; and
  said voltage supply and control block is further configured such that during a negative bias temperature instability effect alternating current stress mode:
    an alternating voltage is applied to said first rail test rail;
    said stress voltage is applied to said first rail parallel rail, said p-stress enable terminal, said p-parallel terminal, and said n-parallel terminal;
    said ground is applied to said input terminal of said first one of said repeating circuit structures, said n-stress enable terminal, said second rail; and
    said first p-type transistor of each of said repeating circuit structures is subject to alternating current stress.

14. A design structure embodied in a machine readable medium, said design structure comprising the ring oscillator circuit of claim 13.

15. The circuit of claim 1, wherein:
  said second rail comprises a second rail test rail coupled to said first drain-source terminals of said first n-type transistors and a second rail parallel rail coupled to said first drain-source terminals of said third n-type transistors; and
  said voltage supply and control block is further configured such that during a positive bias temperature instability effect alternating current stress mode:
    an alternating voltage is applied to said second rail test rail,
    said stress voltage is applied to said p-stress enable terminal, said first rail and said input terminal of said first one of said repeating circuit structures;
    said ground is applied to said n-stress enable terminal, said p-parallel terminal, said n-parallel terminal, and said second rail parallel rail; and
    said first n-type transistor of each of said repeating circuit structures is subject to alternating current stress.

16. A design structure embodied in a machine readable medium, said design structure comprising the ring oscillator circuit of claim 15.

17. A ring oscillator circuit for measurement of negative bias temperature instability effect and positive bias temperature instability effect, said circuit comprising:
  a ring oscillator comprising:
    an odd number of main inverters, said odd number being at least three, each of said main inverters having a an input terminal, an output terminal, a voltage supply terminal, a p-type transistor, and an n-type transistor;
    a plurality of first paths selectively coupling said output terminals of said main inverters to said input terminals of adjacent ones of said main inverters; and
    a plurality of inverting second paths selectively coupling said output terminals of said main inverters to said input terminals of adjacent ones of said main inverters; and
  a voltage supply and control block coupled to said ring oscillator and configured such that:
    during a negative bias temperature instability effect stress mode:
      said input of a first one of said inverters is grounded, a stress voltage is applied to said input terminals of said main inverters, said first paths are opened, and said second paths are operative to invert a signal appearing at said output terminals of said main inverters to obtain an inverted signal, and to supply said inverted signal to said input terminals of said adjacent ones of said main inverters, whereby said p-type transistors are stressed;

during a positive bias temperature instability effect stress mode:

said stress voltage is applied to said input terminals of said main inverters and said input of said first one of said inverters, said first paths are opened, and said second paths are operative to invert a signal appearing at said output terminals of said main inverters to obtain an inverted signal, and to supply said inverted signal to said input terminals of said adjacent ones of said main inverters, whereby said n-type transistors are stressed; and during a measurement mode:

a nominal voltage is applied to said input terminals of said main inverters, said first paths are conductive, and said second paths are opened.

18. A design structure embodied in a machine readable medium, said design structure comprising the ring oscillator circuit of claim 17.

19. A circuit for measuring bias temperature instability effect in pass gates, said circuit comprising:

a ring oscillator comprising:

an odd number of inverters, said odd number being at least three, each of said inverters having an input terminal, an output terminal, first and second voltage supply terminals, said first voltage supply terminals of all said inverters being coupled, and said second voltage supply terminals of all said inverters being coupled;

a plurality of pass transistors configured as said pass gates, coupling said output terminals of said inverters to said input terminals of adjacent ones of said inverters; and a plurality of supplemental transistors selectively coupling said inputs of said inverters to:

said second voltage supply terminals, in a case when said pass transistors are p-type, and said first voltage supply terminals, in a case when said pass transistors are n-type; and a voltage supply and control block coupled to said ring oscillator and configured such that:

in a stress mode, said pass transistors are stressed and said supplemental transistors are on; and in a measurement mode, said pass transistors operate with nominal voltage and said supplemental transistors are off.

20. A design structure embodied in a machine readable medium, said design structure comprising the circuit of claim 19.

* * * * *